United States Patent
Brooks

(10) Patent No.: US 9,514,812 B2
(45) Date of Patent: Dec. 6, 2016

(54) APPARATUS AND METHOD FOR READING A STORAGE DEVICE WITH A RING OSCILLATOR AND A TIME-TO-DIGITAL CIRCUIT

(71) Applicant: Hewlett-Packard Development Company, L.P., Houston, TX (US)

(72) Inventor: Robert J. Brooks, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/760,191

(22) PCT Filed: Mar. 28, 2013

(86) PCT No.: PCT/US2013/034409
§ 371 (c)(1),
(2) Date: Jul. 9, 2015

(87) PCT Pub. No.: WO2014/158170
PCT Pub. Date: Oct. 2, 2014

(65) Prior Publication Data
US 2016/0042787 A1 Feb. 11, 2016

(51) Int. Cl.
*G11C 7/06* (2006.01)
*G11C 13/00* (2006.01)

(52) U.S. Cl.
CPC .............. *G11C 13/004* (2013.01); *G11C 7/06* (2013.01); *G11C 13/0004* (2013.01);
(Continued)

(58) Field of Classification Search
CPC ......... G11C 7/08; G11C 7/06; G11C 13/0002; G11C 13/004; G11C 13/0061; G11C 13/0004; G11C 13/0007; G11C 13/0011; G11C 11/5642; G11C 11/5678; G11C 11/5685; G11C 2013/004; G11C 2207/066
See application file for complete search history.

(56) References Cited

U.S. PATENT DOCUMENTS 4,831,592 A    5/1989  Nakai et al.
5,144,525 A    9/1992  Saxe et al.
(Continued)

FOREIGN PATENT DOCUMENTS

EP    2503556       9/2012
JP    2003-257173   9/2003
(Continued)

OTHER PUBLICATIONS

Ngspice, XSPICE in Ngspice howto, Ngspice and XSPICE installation, downlad date Oct. 22, 2012. http://ngspice.sourceforge.net/xspicehowto.html.
(Continued)

*Primary Examiner* — Andrew Q Tran
(74) *Attorney, Agent, or Firm* — Mannava & Kang, P.C.

(57) ABSTRACT

According to an example, a method for storage device reading may include receiving an input signal indicative of a period of oscillation of a ring oscillator coupled to a storage device of a plurality of storage devices, and measuring the period of oscillation of the ring oscillator by a time-to-digital circuit. The method for storage device reading may further include determining a value of data stored in the storage device based on the measurement.

10 Claims, 3 Drawing Sheets

(52) U.S. Cl.
CPC ...... *G11C 13/0061* (2013.01); *G11C 13/0069* (2013.01); *G11C 2207/066* (2013.01)

(56) References Cited

U.S. PATENT DOCUMENTS

| | | | |
|---|---|---|---|
| 5,191,336 | A * | 3/1993 | Stephenson ........... G04F 10/005 341/111 |
| 5,363,333 | A | 11/1994 | Tsujimoto |
| 6,990,030 | B2 | 1/2006 | Lemus et al. |
| 7,483,327 | B2 | 1/2009 | Qureshi et al. |
| 7,620,510 | B2 * | 11/2009 | Carpenter ........ G01R 31/31725 702/182 |
| 7,782,107 | B2 | 8/2010 | Dixit |
| 7,782,242 | B2 | 8/2010 | Rivoir |
| 7,788,554 | B2 | 8/2010 | Adams et al. |
| 7,876,598 | B2 | 1/2011 | Schroegmeier et al. |
| 8,923,073 | B2 * | 12/2014 | Brooks ................ G11C 7/1015 365/148 |
| 2006/0103566 | A1 | 5/2006 | Vemulapalli |
| 2007/0001682 | A1 | 1/2007 | Habitz |
| 2007/0086232 | A1 | 4/2007 | Joshi et al. |
| 2007/0237012 | A1 | 10/2007 | Kuang et al. |
| 2008/0043521 | A1 | 2/2008 | Liaw et al. |
| 2008/0253200 | A1 | 10/2008 | Wuidart |
| 2008/0273403 | A1 | 11/2008 | Ehrenreich et al. |
| 2009/0027065 | A1 | 1/2009 | Kuang et al. |
| 2009/0219756 | A1 | 9/2009 | Schroegmeier et al. |
| 2009/0237984 | A1 | 9/2009 | Porter |
| 2009/0327620 | A1 | 12/2009 | Arsovski et al. |
| 2010/0110751 | A1 | 5/2010 | Miyajima et al. |
| 2011/0133973 | A1 | 6/2011 | Yamamoto |
| 2012/0195099 | A1 | 8/2012 | Miao et al. |
| 2012/0273955 | A1 | 11/2012 | or-Bach et al. |

FOREIGN PATENT DOCUMENTS

| | | |
|---|---|---|
| JP | 2012-518862 | 8/2012 |
| KR | 100631935 | 10/2006 |
| KR | 100942973 | 2/2010 |
| WO | WO-2010/097302 | 9/2010 |
| WO | WO-2012060807 | 5/2012 |
| WO | WO-2012067660 | 5/2012 |

OTHER PUBLICATIONS

International Search Report and Written Opinion dated Dec. 27, 2013. Issued on PCT Patent Application No. PCT/US2013/034409 filed on Mar. 28, 2013, Korean Intellectual Property Office.
Crankshaw, et al. An RSFQ Variable Duty Cycle Oscillator for Driving a Superconductive Qubit. IEEE Transactions on Applied Superconductivity, vol. 13, No. 2. Jun. 2003.
JPO; Japanese Office Action cited in Jp application No. 2013-534887: dated Dec. 17, 2013; 4 pages.
Korean Intellectual Property Office, International Search Report and Written Opinion for International Appl. No. PCT/US2010/054922 dated Jul. 1, 2011 (8 pages).
The International Bureau of WIPO, international Preliminary Report on Patentability for International Appl. No. PCT/US2010/054922 dated May 16, 2013 (6 pages).

* cited by examiner

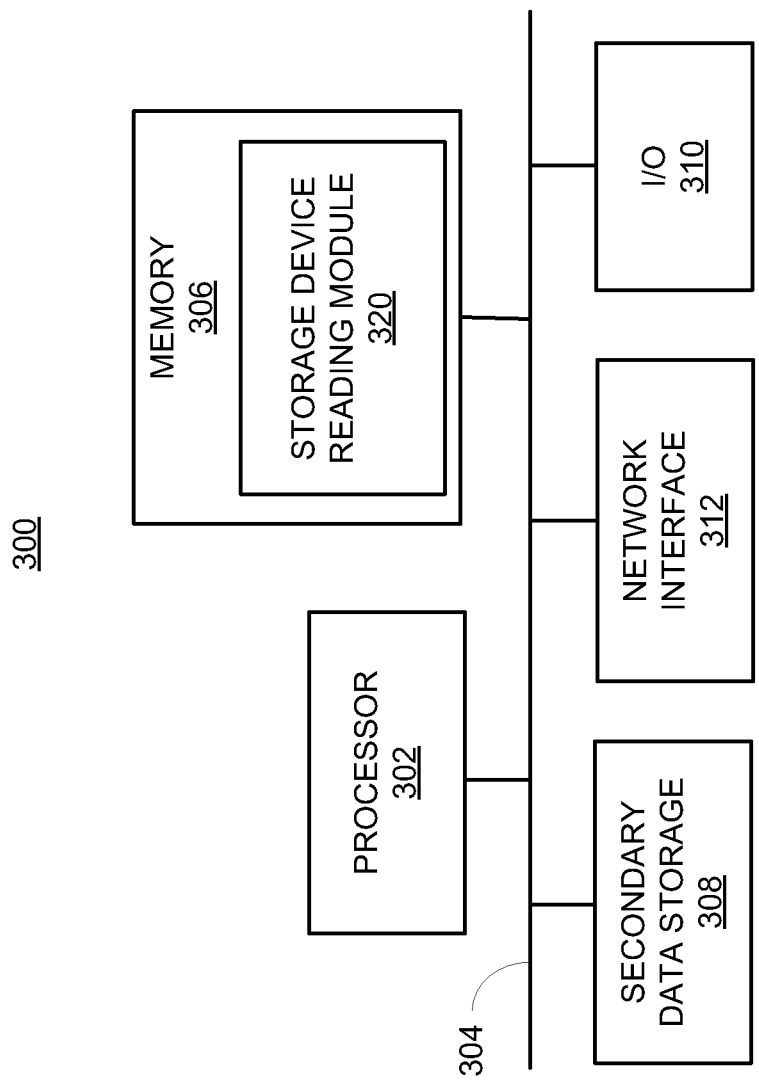

APPARATUS AND METHOD FOR READING A STORAGE DEVICE WITH A RING OSCILLATOR AND A TIME-TO-DIGITAL CIRCUIT

CLAIM FOR PRIORITY

The present application is a national stage filing under 35 U.S.C 371 of PCT application number PCT/US2013/034409, having an international filing date of Mar. 28, 2013, the disclosure of which is hereby incorporated by reference in its entirety.

BACKGROUND

In a storage device, such as a memristor, when current flows in one direction through the storage device, the electrical resistance increases, and when current flows in an opposite direction, the electrical resistance decreases. When the current is stopped, the last resistance in the memristor is retained. Further, when the flow of charge begins again, the resistance of the memristor reverts to a value when the memristor was last active. Such storage devices can be formed in an array configuration that includes a plurality of storage devices disposed, for example, in a row and column format. Each of the storage devices in the array can be individually addressed to read or write to the storage device. For example, a row and column can be individually addressed to read or write to a corresponding storage device.

BRIEF DESCRIPTION OF DRAWINGS

Features of the present disclosure are illustrated by way of example and not limited in the following figure(s), in which like numerals indicate like elements, in which:

FIG. 3 illustrates a computer system, according to an example of the present disclosure.

DETAILED DESCRIPTION

Figure 1:
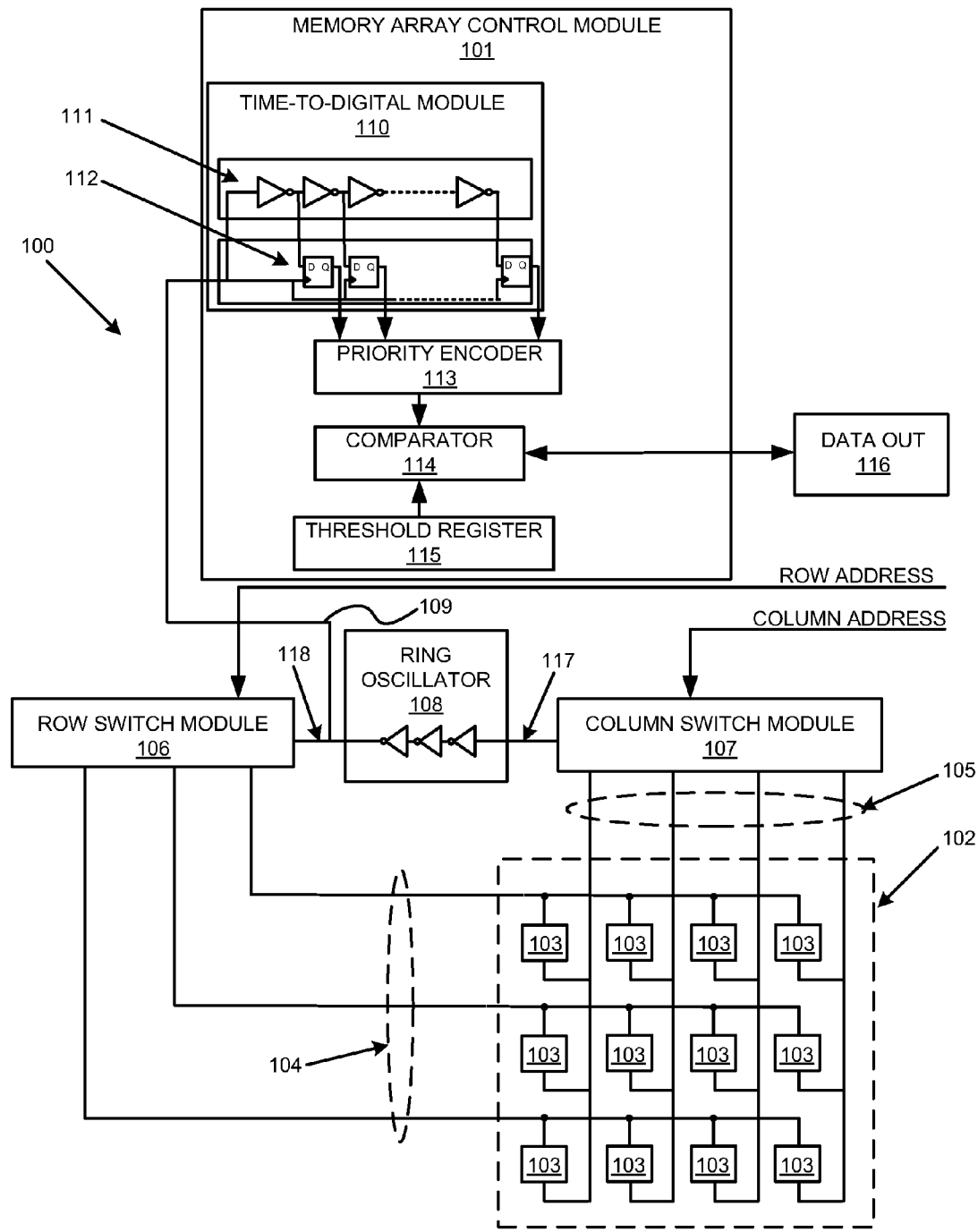
FIG. 1 illustrates an architecture of a storage device reading apparatus, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

A ring oscillator may be connected between a row and column of a storage device, such as a memristor array, to read a bit stored in a memristor addressed by the row and column. The ring oscillator exhibits a characteristic period of oscillation that can be used to determine a value of the bit in the memristor addressed by the row and column. One technique for measuring the period of oscillation may include using an output of the ring oscillator to clock a counter for sufficient cycles to discriminate between frequencies that may be 10% or less different. This technique can take a relatively long time to determine the period of oscillation based, for example, on the number of cycles it can take to discriminate between different frequencies. Another technique for measuring the period of oscillation may include using a counter clocked by a fixed clock that is of a significantly higher frequency than the ring oscillator. Such a counter can be started on an edge of the ring oscillator output, and stopped at a fixed number of edges later. However, such a counter can add complexities and additional power consumption needs to the overall read/write process.

A storage device reading apparatus and a method for storage device reading are disclosed herein, and provide for measurement of the period of oscillation of a ring oscillator with minimal latency. According to an example, the storage device reading apparatus may include a time-to-digital circuit (i.e., of a time-to-digital module) that is used to measure the period of oscillation of a ring oscillator. The measured period of oscillation may be used to determine a value of a bit in a memristor addressed by a row and column in a memory array, such as a memristor array. The time-to-digital circuit may include a series of buffers and a register (for example, a set of latches or flip-flops). The ring oscillator output may be fed to the series of buffers and to a clock input of the register. The length of the series of buffers may be chosen such that the fastest possible propagation delay time of the series of buffers is at least one-half of the longest period that the time-to-digital circuit is designed to measure. A priority encoder circuit may be applied to the register output, and the resulting binary value may represent a measurement of the ring oscillator period. The use of the time-to-digital circuit minimizes any latency in measurement of the period of oscillation of a ring oscillator.

According to an example, the method for storage device reading may include receiving an input signal which is the output of a ring oscillator coupled to a storage device of a plurality of storage devices, and measuring the period of oscillation of the ring oscillator by a time-to-digital circuit.

FIG. 1 illustrates an architecture of a storage device reading apparatus 100, according to an example. Referring to FIG. 1, the apparatus 100 is depicted as including a memory array control module 101 to control a memory array 102 and various other operations of the apparatus 100. The memory array 102 may include a plurality of data storage devices 103, such as memristors. Each of the data storage devices 103 may be individually addressable by row address lines 104 and column address lines 105. A row switch module 106 may couple various aspects of the apparatus 100 to selected ones of the storage devices 103 by the row address lines 104. Similarly, a column switch module 107 may couple various aspects of the apparatus 100 to selected ones of the storage devices 103 by the column address lines 105. A ring oscillator 108 has a characteristic period of oscillation that can be used to determine a value of a bit in the particular storage device 103 addressed by the row address lines 104 and the column address lines 105. An output 109 of the ring oscillator 108 may be fed to a time-to-digital module 110 that includes a time-to-digital circuit. For example, the output 109 of the ring oscillator 108 may be fed to a series of buffers 111 of the time-to-digital module 110. The output of each of the buffers 111 may be fed to a corresponding flip-flop of a series of flip-flops 112. The flip-flops 112 may be clocked with the oscillating signal of the ring oscillator 108, which is included in the output 109.

A priority encoder 113 may determine a binary value corresponding to the period of the ring oscillator 108. The binary value corresponding to the period of oscillation of the ring oscillator 108 may be compared using a comparator 114 to a value stored in a threshold register 115. The output of the comparison by the comparator 114 may be output at 116.

The apparatus 100 and the various components thereof may be implemented in hardware using a variety of digital logic circuits, such as system-on-chips (SoC), application-specific integrated circuits (ASIC), etc. Additionally or alternatively, the apparatus 100 and the various components thereof that perform various other functions in the apparatus 100, may comprise machine readable instructions stored on a non-transitory computer readable medium. In addition, or alternatively, the apparatus 100 and the various components thereof may comprise hardware or a combination of machine readable instructions and hardware.

The memory array control module 101 may control the memory array 102 and various other operations of the apparatus 100. For example, the memory array control module 101 may store data values within the memory array 102, read data values from the memory array 102, control operations of the row switch module 106 and the column switch module 107, receive data values from and provide data values to a source of the apparatus 100, etc. The memory array control module 101 may store (i.e., write or program) data values to the data storage devices 103, for example, by direct-current (DC) pulses formatted to increase or decrease the non-volatile electrical resistance of the selected data storage device 103. The memory array control module 101 may also retrieve (i.e., read) data values stored in the data storage devices 103 by the ring oscillator 108.

The data storage devices 103 may store at least two distinct data values based on electrical characteristics thereof. For example, the data storage devices 103 may include electrical characteristics such as resistance, capacitance, inductance, or a combination thereof. Each data storage device 103 may store one bit of binary data-value (e.g., 0 or 1) based on a non-volatile adjustment in electrical resistance thereof. The data storage devices 103 may also store other types of data-values (e.g., base-three, base-eight, etc.). The memory array 102 may include a plurality of the data storage devices 103, such as memristors. In the example of FIG. 1, the memory array 102 is illustrated as including twelve data storage devices 103. However, those skilled in the art would appreciate in view of this disclosure that the memory array 102 may include any number of the data storage devices 103. Each of the data storage devices 103 may be individually addressable by one of the row address lines 104 and the column address lines 105 to write to or read stored data values.

The row switch module 106 may couple various aspects of the apparatus 100 to selected ones of the storage devices 103 by the row address lines 104. Similarly, the column switch module 107 may couple various aspects of the apparatus 100 to selected ones of the storage devices 103 by the column address lines 105. The row and column switch modules 106 and 107, respectively, may include, field-effect transistors (FETs), pass FETs, pass gates, diodes, bipolar transistors, electromechanical switches, or other devices.

The ring oscillator 108 exhibits a characteristic period of oscillation that can be used to determine a value of a bit stored in the particular storage device 103 addressed by the row address lines 104 and the column address lines 105. The ring oscillator 108 may be defined by or include an odd-number of logical inverter gates coupled in a series-circuit arrangement. The ring oscillator 108 may include an input node 117 and an output node 118. The ring oscillator 108 may also include the output 109 that is fed at the output node 118 to the time-to-digital module 110 that includes the time-to-digital circuit. The ring oscillator 108 may be coupled to selected ones of the storage devices 103 by the row and column switch modules 106 and 107, respectively. A particular storage device 103 may define part of a feedback pathway or loop when coupled to the ring oscillator 108 by the input node 117, the output node 118, the row switch module 106 and the column switch module 107. A selected storage device 103 may be disposed in a series arrangement in a feedback loop with respect to the ring oscillator 108. The feedback loop may be formed upon coupling of the selected storage device 103 with the ring oscillator 108 by the row switch module 106 and the column switch module 107. For example, the ring oscillator 108 may be selectively coupled to the storage devices 103 by the by the row address lines 104 and the column address lines 105 so as to establish a feedback loop.

The ring oscillator 108 may include a period of oscillation that can be used to determine a value of a bit stored in the particular storage device 103 addressed by the row address lines 104 and the column address lines 105. Generally, the period of the oscillation of the ring oscillator 108 may be measured to determine whether the storage device 103 addressed by the row address lines 104 and the column address lines 105 is in a high or a low resistance state. For example, the ring oscillator 108 may include a period of oscillation corresponding to a data value (e.g., a bit) stored in one of the storage devices 103 coupled thereto.

The output 109 of the ring oscillator 108 may be fed to the series of buffers 111 of the time-to-digital module 110. The output of each buffer of the series of buffers 111 may be fed to a corresponding flip-flop of the series of flip-flops 112. Each of the flip-flops 112 may be clocked with an un-buffered oscillating signal of the output 109 of the ring oscillator 108. Each buffer of the series of buffers 111 may include a propagation delay. For example, if the set of outputs of the buffers 111 is viewed as a parallel bus and the parallel bus is clocked on a rising edge of output 109, the first flip-flop of the series of flip-flops 112 records the value prior to the rising edge, that is, a zero. As further buffers 111 and corresponding flip-flops 112 are considered, at a given point, the total delay of the buffers 111 exceeds one-half of the period of the output 109. That flip-flop of the series of flip-flops 112, and flip-flops 112 further down the series see a value that was present prior to the previous falling edge of the output 109, that is, a one. The location of the transition of the input signal to the series of buffers 111 from 1 to 0, or from 0 to 1, may correspond to the measurement of the period of oscillation of the ring oscillator 108.

As discussed herein, the flip-flops 112 may be clocked with the un-buffered oscillating signal of the output 109 of the ring oscillator 108. According to an example, each of the flip-flops 112 may be a positively edged triggered flip-flop (e.g., 20 bits wide). At an instance that a positive edge on the flip-flop clock occurs, the result of the transition from 0 to 1 of the ring oscillator 108 will not have been observed by any of the buffers in the series of buffers 111. At this stage, a first bit of a flip-flop will record a 0. All flip-flop bits thereafter will also record 0's until the ring oscillator 108 output signal (i.e., output 109) has been sufficiently delayed to see a previous 1 to 0 transition. At this point, the flip-flops 112 will see 1's instead of 0's. Moreover, shorter periods of the ring oscillator 108 will result in that transition being seen earlier (that is, more leftward) as a parallel output of the flip-flop bits.

The length of the series of the buffers 111 may be chosen such that the fastest possible propagation delay time of the series of the buffers 111 is at least one-half of the longest period that the time-to-digital module 110 is designed to measure. For example, if the length of the series of the buffers 111 is too short (e.g., less than ½ of the longest possible period of oscillation of the ring oscillator 108), then for the longest period of oscillation of the ring oscillator 108, the most delayed signal at the far end of the series of the buffers 111 would still result in a value of 0. Thus, a length of the series of the buffers 111 (i.e., the number of buffers needed) may be determined by dividing the longest possible period of oscillation of the ring oscillator 108 by 2, and dividing the result by the propagation delay of each buffer of the series of buffers 111.

The priority encoder 113 may include a find-first-one circuit (or a find-first-zero circuit) to determine a binary value corresponding to the period of oscillation of the ring oscillator 108. The priority encoder 113 may receive a series of 1's followed by 0's, or vice versa, from the flip-flops 112, and encode the received series into a binary value. The priority encoder 113 may include a set of parallel inputs form the flip-flops 112 and generate a binary encoded output. According to an example, if the priority encoder 113 includes 20 bits of input and 5 bits of output, if the last bit in the flip-flops 112 (that is, the rightmost bit) is a 1 and the remaining bits are 0, then the output of the priority encoder 113 is a binary 1 (i.e., 00001). According to another example, if the priority encoder 113 includes 20 bits of input and 5 bits of output, if the second bit (that is, second from left most bit) in the flip-flops 112 is a 1, then the output of the priority encoder 113 is a binary 19 (i.e., 10011). Therefore, for the priority encoder 113, an output corresponding to a low number may correspond to a low frequency of the ring oscillator 108 (e.g., a first value of a bit stored in a storage device 103), and an output corresponding to a high number may correspond to a high frequency ring oscillator 108 (e.g., a second value of a bit stored in the storage device 103).

A threshold may be set such that a lower number on the output of the priority encoder 113 causes the comparator 114 to drive a logic zero, and a higher number then the threshold causes the comparator 114 to drive a logic one, or vice-versa. For example, if a storage device 103 stores a 1 or 0, the threshold may be set in a middle of the possible range of outputs of the priority encoder 113.

Figure 2:
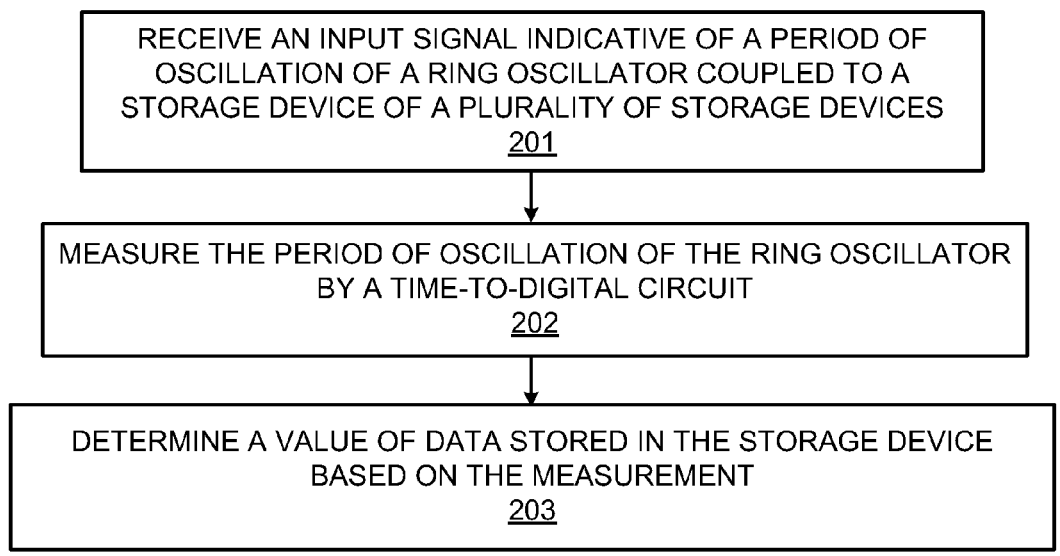
FIG. 2 illustrates a method for storage device reading, according to an example of the present disclosure.

FIG. 2 illustrates a flowchart of method 200 for storage device reading, corresponding to the example of the storage device reading apparatus 100 whose construction is described in detail above. The method 200 may be implemented on the storage device reading apparatus 100 with reference to FIG. 1 by way of example and not limitation. The method 200 may be practiced in other apparatus.

Referring to FIG. 2, for the method 200, at block 201, an input signal indicative of a period of oscillation of a ring oscillator coupled to a storage device of a plurality of storage devices may be received. For example, referring to FIG. 1, the time-to-digital module 110 of the memory array control module 101 may receive an input signal (i.e., the output 109 of the ring oscillator 108) exhibiting a characteristic period of oscillation of the ring oscillator 108 coupled to a storage device 103 of a plurality of storage devices (i.e., the memory array 102).

At block 202, the period of oscillation of the ring oscillator may be measured by a time-to-digital circuit. For example, referring to FIG. 1, the period of oscillation of the ring oscillator 108 may be measured by the time-to-digital circuit (e.g., the time-to-digital module 110 that includes a time-to-digital circuit).

At block 203, a value of data stored in the storage device may be determined based on the measurement. For example, referring to FIG. 1, a value of data stored in the storage device 103 may be determined based on the measurement.

FIG. 3 shows a computer system 300 that may be used with the embodiments described herein. The computer system 300 may represent a generic platform that may include components that may be in a server or another computer system. The computer system 300 may be used as a platform for the apparatus 100. The computer system 300 may execute, by a processor or other hardware processing circuit, the methods, functions and other processes described herein. These methods, functions and other processes may be embodied as machine readable instructions stored on computer readable medium, which may be non-transitory, such as, for example, hardware storage devices (e.g., RAM (random access memory), ROM (read only memory), EPROM (erasable, programmable ROM), EEPROM (electrically erasable, programmable ROM), hard drives, and flash memory).

The computer system 300 may include a processor 302 that may implement or execute machine readable instructions performing some or all of the methods, functions and other processes described herein. Commands and data from the processor 302 may be communicated over a communication bus 304. The computer system 300 may also include a main memory 306, such as, for example, a random access memory (RAM), where the machine readable instructions and data for the processor 302 may reside during runtime, and a secondary data storage 308, which may be non-volatile and stores machine readable instructions and data. The memory and data storage may be examples of computer readable mediums. The memory 306 may include a storage device reading module 320 including machine readable instructions residing in the memory 306 during runtime and executed by the processor 302. The storage device reading module 320 may include the modules of the apparatus 100 shown in FIG. 1.

The computer system 300 may include an I/O device 310, such as, for example, a keyboard, a mouse, a display, etc. The computer system 300 may include a network interface 312 for connecting to a network. Other known electronic components may be added or substituted in the computer system 300.

While the embodiments have been described with reference to examples, various modifications to the described embodiments may be made without departing from the scope of the claimed embodiments.

What is claimed is:

1. A method for storage device reading, the method comprising:
   receiving an input signal indicative of a period of oscillation of a ring oscillator coupled to a storage device of a plurality of storage devices;
   measuring the period of oscillation of the ring oscillator by a time-to-digital circuit; and
   determining a value of data stored in the storage device based on the measurement.

2. The method of claim 1, wherein the storage device is a memristor.

3. The method of claim 1, wherein the plurality of storage devices represent a memristor array.

4. The method of claim 1, wherein measuring the period of oscillation of the ring oscillator by the time-to-digital circuit further comprises:

feeding the input signal to a series of buffers of the time-to-digital circuit; and feeding the input signal to a clock input of a flip-flop associated with each buffer of the series of buffers.

5. The method of claim 1, further comprising:

determining a length of a series of buffers of the time-to-digital circuit such that a fastest possible propagation delay time of the series of buffers is at least one-half of a longest period of oscillation of the ring oscillator.

6. The method of claim 1, wherein determining the value of data stored in the storage device based on the measurement further comprises:

using a find-first-one circuit for an output of a series of flip-flops of the time-to-digital circuit to determine the value of data stored in the storage device.

7. The method of claim 1, wherein determining the value of data stored in the storage device based on the measurement further comprises:

using a find-first-zero circuit for an output of a series of flip-flops of the time-to-digital circuit to determine the value of data stored in the storage device.

8. The method of claim 1, wherein determining the value of data stored in the storage device based on the measurement further comprises:

using a priority encoder for an output of a series of flip-flops of the time-to-digital circuit to generate a binary value corresponding to the period of oscillation of the ring oscillator.

9. The method of claim 1, wherein determining the value of data stored in the storage device based on the measurement further comprises:

determining the value of a bit stored in the storage device.

10. A non-transitory computer readable medium having stored thereon machine readable instructions for storage device reading, the machine readable instructions when executed cause a computer system to:

receive an input signal indicative of a period of oscillation of a ring oscillator coupled to a storage device of a plurality of storage devices;

measure the period of oscillation of the ring oscillator by a time-to-digital circuit by feeding the input signal to a series of buffers of the time-to-digital circuit, and feeding the input signal to a clock input of a flip-flop associated with each buffer of the series of buffers; and determine, by a processor, a value of data stored in the storage device based on the measurement.

* * * * *